United States Patent [19]

Walden et al.

[11] Patent Number: 4,783,690
[45] Date of Patent: Nov. 8, 1988

[54] POWER SEMICONDUCTOR DEVICE WITH MAIN CURRENT SECTION AND EMULATION CURRENT SECTION

[75] Inventors: John P. Walden, Schenectady; Eric J. Wildi, Clifton Park, both of N.Y.

[73] Assignee: General Electric Company, Schenectady, N.Y.

[21] Appl. No.: 892,739

[22] Filed: Jul. 31, 1986

Related U.S. Application Data

[63] Continuation of Ser. No. 529,240, Sep. 6, 1983, abandoned.

[51] Int. Cl.$^4$ ............... H01L 29/72; H01L 29/78; H01L 23/56; H02H 3/00
[52] U.S. Cl. ........................... 357/23.4; 357/28; 357/23.1; 357/23.14; 357/36; 361/93; 361/87
[58] Field of Search ............ 357/23.1, 23.4, 36, 357/28, 38, 23.14; 361/93, 87, 103

[56] References Cited

U.S. PATENT DOCUMENTS 4,136,354  1/1979  Dobkin ........................... 357/28
4,682,197  7/1987  Villa et al. ..................... 357/28

FOREIGN PATENT DOCUMENTS 1045769  10/1966  United Kingdom ............ 357/23.1
2082385A  3/1982  United Kingdom ............ 357/23.4

OTHER PUBLICATIONS

Elliot et al., "Self-Limiting Off-Chip Driver", IBM Technical Disclosure Bulletin, vol. 16, No. 8, Jan. 1974, pp. 2679-2680.
Pelly, B. R., "The Do's and Dont's of Using Power HEXFETs", HEXFET Databook, International Rectifier, C. 1981, pp. 6-11.
B. J. Baliga et al., "The Insulated Gate Rectifier (IGR): A New Power Switching Device", IEDM 82 (Dec. 1982), pp. 264-267.
J. Tihanyi, "Functional Integration of Power MOS and Bipolar Devices", IEDM Technical Digest, Dec. 8th-10th, 1980, Washington, DC, pp. 75-76.

Primary Examiner—Andrew J. James
Assistant Examiner—Robert P. Limanek
Attorney, Agent, or Firm—Robert Ochis; James C. Davis, Jr.; Marvin Snyder

[57] ABSTRACT

A power semiconductor device incorporates in its active, or current-carrying, region a main current section and an emulation current section. The active region is surrounded by a common device termination region. This is accomplished through provision of respective separate cathodes for the main and emulation current regions, while the device anode is common to both the main and emulation current sections. The current level in the emulation current section provides an accurate representation of the current level in the main current section since the main and emulation current sections are closely coupled both thermally and electrically and, further, are formed in the same fabrication process. The current level in the main current section can be economically determined with low power circuitry by way of sensing the current level in the emulation current section.

18 Claims, 2 Drawing Sheets

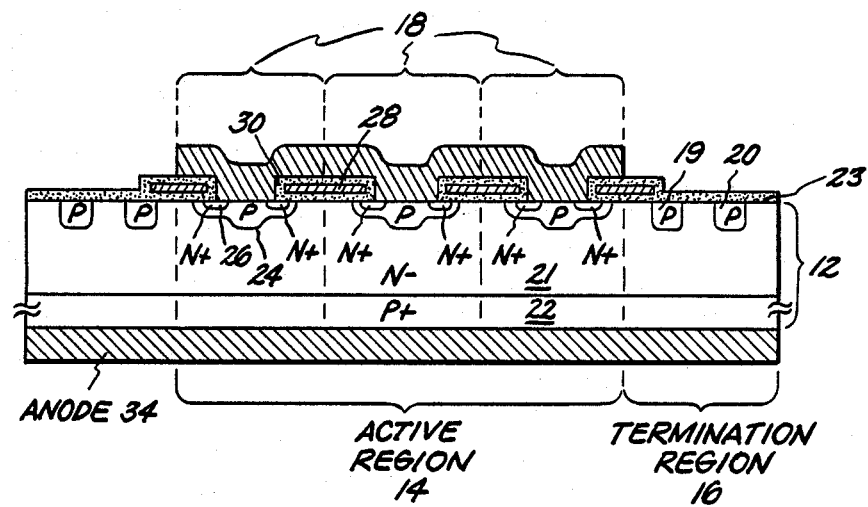
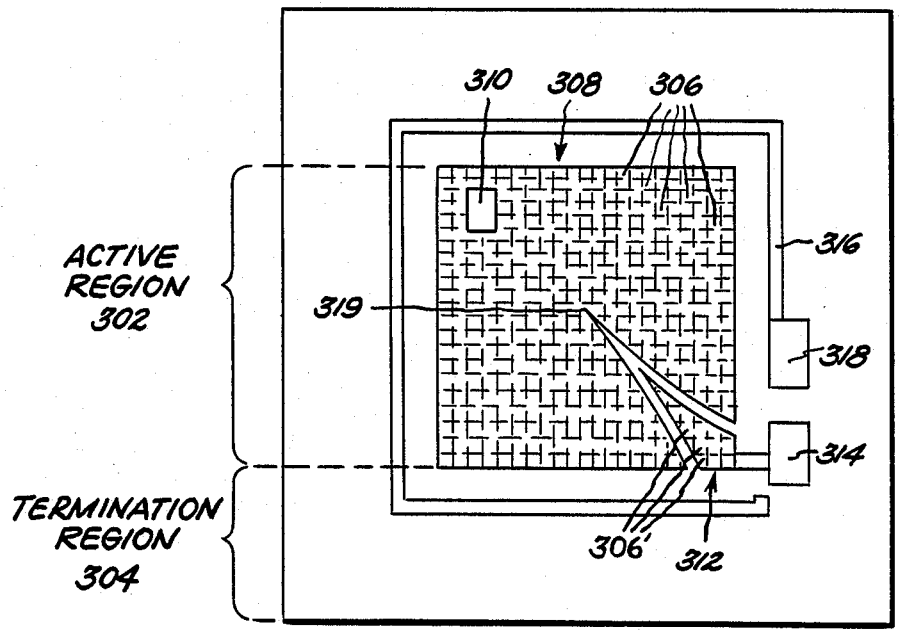

POWER SEMICONDUCTOR DEVICE WITH MAIN CURRENT SECTION AND EMULATION CURRENT SECTION

This application is a continuation of application Ser. No. 529,240, filed Sept. 6, 1983, now abandoned.

BACKGROUND AND SUMMARY OF THE INVENTION

The present invention relates to a power semiconductor device having a main current section and an emulation current section that emulates, or follows, the current in the main current section.

Power semiconductor devices are devices designed to carry power level electrical current, such as current for powering an alternating current motor. It is often useful to limit the current in power devices for one of two basic reasons. First the power device may have an internal current limit above which the device switches into an undesirable mode of operation, possibly destructive to the power device. Second, the electrical system in which the power device is utilized may be able to tolerate only a particular maximum current level in the power device, above which deleterious circuit behavior results in the system.

In order to be able to limit current in a power semiconductor device, the device current level must first be sensed. One prior art technique of sensing current level in a power device involves sensing the voltage drop developed across a resistor that is serially connected to the power device. Unfortunately, the sensing resistor must be rated for a considerable level of power, and thereby results in an increased expense of current sensing.

Accordingly, an object of the present invention is to provide a power semiconductor device in which the device current level can be sensed with low power circuitry.

A further object of the invention is to provide a power semiconductor device in which the device current can be sensed economically and with high accuracy.

Another object of the invention is to provide a power semiconductor device in which low current emulation of the device current level is achieved without increasing the number of device fabrication steps.

In accordance with a preferred embodiment of the invention, there is provided a power semiconductor device having a plurality of active (i.e. current -carrying) region cells and a device termination region. A majority of the active region cells constitute a main current section and a minority of the active region cells constitute an emulation current section. The device termination region is common to, and surrounds both the main current section and the emulation current section in the preferred embodiment. A first cathode contacts the main current section, while a separate, second cathode contacts the emulation current section. A common anode contacts both the main current section and the emulation current section, and a gate is coupled to the main current section and, preferably, to the emulation current section.

The current level in the emulation current section closely emulates the current level in the main current section, owing to close thermal and electrical coupling between these sections, and, further, because they are formed in the same fabrication process. Since the current level in the emulation section constitutes only a fraction of that in the main current section, low power circuitry can be used to sense current in the power device by sensing current in the emulation section. Additionally, the present power device is only slightly more complex than a device without an emulation current section; accordingly, resulting economical current sensing is made possible by the present invention.

BRIEF DESCRIPTION OF THE DRAWINGS

The features of the invention deemed to be novel are defined in the appended claims. The invention itself, however, both as to organization and method of operation, together with further objects and advantages thereof, may best be understood with reference to the following description when read in conjunction with the accompanying drawings, in which:

FIG. 2 is a cross-sectional view of the device of FIG. 1 taken along line 2—2 of FIG. 1; and FIG. 3 is a simplified top plan view of a further power semiconductor device in accordance with the present invention.

DESCRIPTION OF THE PREFERRED EMBODIMENTS

Figure 1:
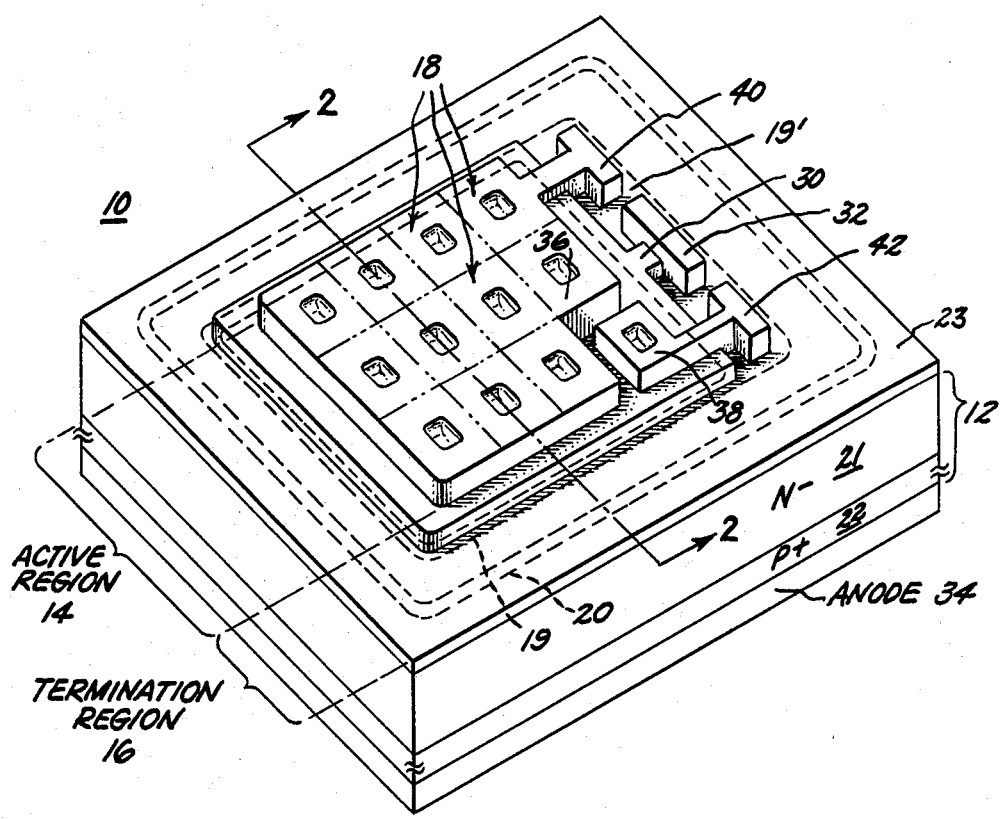
FIG. 1 is a tridimensional view of an exemplary power semiconductor device in accordance with the present invention.

There is shown in FIG. 1 a preferred power semiconductor device 10 in accordance with the present invention. Device 10 comprises a semiconductor wafer 12, such as silicon, including an active, or current-carrying, region 14 and a termination region 16 surrounding active region 14 and extending outward to the edge of the device.

Active region 14 preferably contains a plurality of cells 18, suitably identical to each other, that are schematically depicted by dashed-line squares. Termination region 16 includes, as essential elements, guard ring 19 and field ring 20 (both shown in dashed lines) or any other suitable termination structure for power devices as will be apparent to those skilled in the art. Further details of an examplary termination region 16 and an exemplary structure for cells 18 are illustrated in the cross-sectional view of FIG. 2, which is taken along line 2—2 in FIG. 1. In FIG. 2, guard ring 19 and field ring 20 of termination region 16 can be seen to compromise respective P-conductivity type regions adjoining the upper portion of an N-conductivity type region 21. An oxide or other insulating layer 23 covers guard ring 19, field ring 20 and N-type layer 21. Cells 18 of active region 14 are shown as each constituting a cell of an insulated gate transistor (IGT), a device that is described (albeit with a different name) in an article by B. J. Baliga, M. S. Adler, P. V. Gray and R. P. Love, entitled "The Insulated Gate Rectifier (IGR): A New Power Switching Device," IEDM 82 (December 1982), pages 264-267, which is incorporated herein by reference. The leftmost IGT cell 18 in FIG. 2 comprises a highly-doped, P-conductivity type region 22, preferably a bulk substrate, which is overlaid by lightly-doped N-conductivity type region 21, which is preferably grown epitaxially on P-conductivity type region 22. N-conductivity type region 21, in turn, is overlaid by a P-conductivity type region 24, which typically comprises two portions of different resistivity. P-conductivity type region 24, in turn, is overlaid by a highly-doped N-conductivity type region 26. P region 24, when viewed from above, is suitably configured with a rectangular or circular boundary, for example, while N region 26, when viewed from above, is suitably configured as a rectangular or circular loop within P region 24, for example. A gate 28, shown in simplified form, preferably comprises a common gate for each of cells 18 and may be formed of conductive polysilicon or other conductive refractory material. Gate 28 is spaced from the upper surface of wafer 12 by silicon dioxide or other insulating layer(s) 30, which also covers the top and sides of gate 28. The other cells 18 are suitably identical to the just-described, leftmost cell 18.

Referring again to FIG. 1, a portion of gate 28, (not visible) that is covered by oxide 30 suitably contacts a metallic bonding pad 32, which is separated from an enlarged portion 19' of guard ring 19 by oxide or other insulating layer 23. On the underside of wafer 12 is an anode 34, suitably comprising a deposited metal such as aluminum and constituting a common anode for each of cells 18. In accordance with the present invention, two separate cathodes 36 and 38 are provided. Cathode 36 contacts a majority of cells 18 of active region 14, while cathode 38 contacts a minority of cells 18 of active region 14 (that is, in device 10, only one cell).

Cathode 36 is connected to a bonding pad 40, which is separated from enlarged guard ring portion 19' by oxide 22, but in the preferred embodiment directly contacts enlarged guard ring portion 19', which then would be at the same voltage as cathode 36.

The cells 18 that are contacted by cathode 36 constitute what is referred to herein as a "main current section", and the cell 18 that is contacted by cathode 38 constitutes what is referred to herein as an "emulation current section". In fabricating power semiconductor device 10 comprising IGT cells 18, conventional processing techniques for fabricating an IGT with a single cathode and a single pad therefor may be employed with an essential alteration being that two cathodes 36 and 38 and their corresponding bonding pads 40 and 42 must be provided. This can be readily accomplished by modifying the cathode-defining mask (not shown) when cathode metallization is deposited on wafer 12 in a manner well-known to those skilled in the art so that it defines two cathodes and two bonding pads. No increase in the number of fabricating steps results, and power semiconductor device 10 is only slightly more complex than a power semiconductor device having a single cathode and a single bonding pad connected thereto. Accordingly, power device 10 may be made for only a slight increase in cost over a conventional device.

In operation of power semiconductor device 10, the current level in the emulation current section of the device is closely proportional to the current level in the main current section of the device, since these sections are closely coupled both thermally and electrically and, further, because these sections are formed in the same fabrication process. In regard to the thermal coupling, when the main current section fluctuates in temperature, for example, rising in temperature during current conduction, the temperature of the emulation current section closely follows the main current section temperature due to the proximity of these sections. With regard to the close electrical coupling of these sections, gate 28 (FIG. 2), when commonly interconnected to both of the sections provides a short electrical path between the respective gate portions for each section, and, similarly, anode 34 provides a short electrical path between both of the sections. This minimizes any parasitic capacitance or inductance that is inherent in the interconnecting electrical paths between the respective gate and anode portions of the main current section and the emulation current section. For reasons that will be apparent to those skilled in the art, this close thermal and electrical coupling results in the current level in the emulation current section being closely proportional to the current level in the main current section, especially during dynamic device operating conditions, such as when device 10 rapidly turns on and off. A further advantage of power device 10 is that the level of current in the main current section can be sensed by external circuitry (not shown) of a low power rating. This is because only a fraction of the current of device 10, that is, the current in the emulation current section, needs to be sensed in order to determine the current level in the main current section.

Power semiconductor device 10 can be modified in various ways and still function in accordance with the present invention. For example, the emulation current section could be formed in wafer 12 at a distal location from the active region. This, however, results in more space on wafer 12 being used since separate device termination regions would be required for both the main and emulation current sections, in contrast to device termination region 16 of power device 10, which is common to both the main and emulation current sections. Additionally, gate 28 (FIG. 2) could be separated into two gate sections, one for the main current section and one for the emulation current section. This would permit independent control of the main and emulation current sections by the respective gates. Moreover, the emulation current section cell or cells can be different in size and structure than the cells of the main current section. A different cell size does not result in loss of current emulation by the emulation current section, but changes the fraction of device current conducted by the emulation current section. With regard to cell structure, emulation current section cells could be formed without either or both of gate 28 (FIG. 2) and N-conductivity region 26 (FIG. 2). Further, while cells 18 of power device 10 have been particularly described as IGT cells, cells 18 could comprise other power device cells, such as Metal-Oxide-Semiconductor Field-Effect Transistor (MOSFET) cells or MOS-gated thyristor cells. Power device 10 could alternatively comprise a power bipolar transistor or a power P-I-N diode, in either of these cases with the main current section and the emulation current section each preferably comprising a single cell, different in size from the other. Furthermore, power device 10 could comprise more than one emulation current section if desired, for example, to simplify external current sensing circuitry (not shown). With regard to MOSFETs and bipolar transistors, "anode" as used herein is intended to signify the drain contact of a MOSFET as well as the collector contact of a bipolar transistor; "cathode" as used herein is intended to signify the source contact of a MOSFET as well as the emitter contact of a bipolar transistor; and "gate" as used herein is intended to signify the control contact of a MUSFET as well as the base contact of a bipolar transistor.

In accordance with a further embodiment of the invention, a power semiconductor device 300 is shown in simplified, top plan view in FIG. 3. Device 300 includes an active region 302 and a device termination region 304 surrounding active region 302 and extending to the peripherey of the device. Termination region 304 comprises any suitable termination region such as described above with regard to device 10 of FIG. 1. Active region 302 includes a multiplicity of cells 306 and 306′0 schematically shown as individual squares. Cells 306 and 306′ may each comprise IGT cells or MOSFET cells, by way of example.

Power semiconductor device 300 includes a main cathode 308 connected to a bonding pad area 310 located above active region 302. Device 300 further includes a separate emulation cathode 312, which is connected to a bonding pad 314 located above termination region 304. Main cathode 308 contacts cells 306 that constitute a main current section, and emulation cathode 312 contacts cells 306′ that constitute an emulation current section. Device 300 also includes a gate (not shown), preferably of conductive polysilicon, which is coupled to cells 306 and 306′ and which is connected to a metallic gate ring 316 and, thence, to gate bonding pad 318, both metallic gate ring 316 and gate bonding pad 318 being located over termination region 304. During turn-on of power semiconductor device 300, a control voltage is applied by external circuitry (not shown) to gate bonding pad 318, and, thence, to metallic gate ring 316. Such control voltage is transmitted from metallic gate ring 316 towards the center 319 of active region 302, first, through a conductive structure interconnecting metallic gate ring 316 and the gate (not shown) and, second, through the gate. Transfer of the voltage through a polysilicon gate conductor is slower than through a metal such as metallic gate ring 316, due to the greater electrical resistance of the polysilicon that interreacts with the capacitance of the gate coupled to each of cells 306 and 306′. Accordingly, the cells at a large radial distance from center 319, for example at the periphery of active region 302, turn on before the lesser number of cells at a lesser radial distance from center 319. In accordance with the invention, emulation cathode 312, which contacts cells 306′ of the emulation current section, is configured in such a way as to contact a larger number of cells 306′ at a greater radial distance from center 316 than at a lesser radial distance. This results in the emulation current section turning on at approximately the same rate as the main current section. An optimal configuration for emulation cathode 312 will be readily determinable by those skilled in the art.

The foregoing describes various embodiments of a power semiconductor device having a main current section and an emulation current section, which beneficially conducts only a fraction of the current of the main current section. Additionally, the emulation current section beneficially permits current sensing of device current level with low power circuitry and may be economically provided in the device.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A power semiconductor device comprising:
   an active region having a perimeter and including a plurality of active region cells, a first subset of said cells constituting a main current section and a second subset of said cells constituting an emulation current section, each of said subsets including more than one of said cells;
   a common anode contacting said main current section and said emulation current section;
   a first cathode contacting each of said cells of said first subset and none of said cells of said second subset;
   a second cathode separate from said first cathode contacting each of said cells of said second subset and none of said cells of said first subset;
   a common device termination region surrounding said active region; and
   said cells of said second subset being distributed at various distances from said perimeter, with a larger number of said second cells being disposed at relatively small distances from said perimeter than are disposed at relatively large distances from said perimeter whereby the current level in said emulation current section is closely proportional to the current level in said main current section during device turn-on and turn-off.

2. The power semiconductor device of claim 1 further including a second gate coupled to said emulation current section.

3. The power semiconductor device of claim 2 wherein said first and second gates comprise a commonly-interconnected gate.

4. A power semiconductor device comprising:
   an active region including a plurality of active region cells which are substantially identical in size and structure to each other, at least three of said cells constituting an emulation current section and others of said cells constituting a main current section, said main current section comprising more cells than said emulation current section;
   a common power contact contacting said main current section and said emulation current section;
   a first power contact contacting said main current section and not contacting said emulation current section;
   a second power contact spaced from said first power contact contacting said emulation current section and not contacting said main current section;
   a common device termination region surrounding said active region including said main current section and said emulation current section; and
   said cells of said emulation current section being distributed at various distances from said perimeter, with a larger number of said emulation current cells being disposed at relatively small distances from said perimeter than at relatively large distances from said perimeter, whereby the current level in said emulation current section is closely proportional to the current level in said main current section during device turn-on and turn-off.

5. The semiconductor device of claim 1 wherein said active region cells each comprise insulated gate transistor cells.

6. The power semiconductor device of claim 1 wherein said active region comprises silicon semiconductor material.

7. The power semiconductor device of claim 1 further including a first gate coupled to said main current section.

8. The semiconductor power device recited in claim 1 wherein said emulation current section is generally wedge shaped and is disposed with the narrow end of the wedge near the center of said active region and the wide end of the wedge near said perimeter of said active region.

9. A power semiconductor device comprising:
an active region having a perimeter including a main current section including a first plurality of main current cells and an emulation current section including a second plurality of emulation current cells;
a common first power contact contacting said main current cells and said emulation current cells;
a second contact contacting said main current cells and not contacting said emulation current cells;
a third power contact spaced from said second power contact and contacting said emulation current cells and not contacting said main current cells;
a common device termination region surrounding said active region; and
said emulation current cells being distributed within said active region in a manner in which a larger number of said emulation current cells are disposed relatiely close to said perimeter than are disposed relatively far from said perimeter, which causes the current in said emulation current section to have a known relationship to the current in the main current section during turn-on and turn-off.

10. The power semiconductor device recited in claim 9 wherein the current in said emulation current section is a constant times the current in said main current section.

11. The power semiconductor device recited in claim 9 wherein the structure of each of said current emulation cells is substantially identical to the structure of a main current cell.

12. The power semiconductor device recited in claim 11 wherein the current in an emulation current cell is a constant times the current in a main current cell.

13. The power semiconductor device recited in claim 9 wherein:
some of said main current cells are disposed adjacent said perimeter.

14. The power semiconductor device recited in claim 9 wherein:
a majority of said active region cells which are disposed adjacent said perimeter are main current cells.

15. The power semiconductor device recited in claim 1 wherein:
some of said main current cells are disposed adjacent said perimeter.

16. The power semiconductor device recited in claim 1 wherein:
a majority of said active region cells which are disposed adjacent said perimeter are main current cells.

17. The power semiconductor device recited in claim 4 wherein:
some of said main current cells are disposed adjacent said perimeter.

18. The power semiconductor device recited in claim 4 wherein:
a majority of said active region cells which are disposed adjacent said perimeter are main current cells.

* * * * *